United States Patent
Tateyama et al.

(10) Patent No.: US 6,837,672 B1
(45) Date of Patent: Jan. 4, 2005

(54) APPARATUS FOR AND METHOD OF TRANSFERRING SUBSTRATES

(75) Inventors: Kiyohisa Tateyama, Kumamoto (JP); Hideyuki Takamori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 701 days.

(21) Appl. No.: 09/676,496

(22) Filed: Oct. 2, 2000

Related U.S. Application Data (62) Division of application No. 09/075,927, filed on May 12, 1998, now Pat. No. 6,152,677.

(30) Foreign Application Priority Data

May 15, 1997 (JP) .............................................. 9-139143

(51) Int. Cl.[7] .............................................. B65G 49/07
(52) U.S. Cl. ...................... 414/815; 414/941; 294/64.1; 901/40
(58) Field of Search ................................. 414/627, 736, 414/737, 752.1, 815, 941; 294/64.1; 901/40

(56) References Cited

U.S. PATENT DOCUMENTS

| | | | | |
|---|---|---|---|---|
| 4,505,636 A | * | 3/1985 | Sugino et al. ............... | 414/736 |
| 4,971,512 A | * | 11/1990 | Lee et al. ................. | 414/744.8 |
| 5,007,784 A | * | 4/1991 | Genov et al. ............. | 414/744.6 |
| 5,123,804 A | * | 6/1992 | Ishii et al. ................. | 414/680 |
| 5,135,349 A | * | 8/1992 | Lorenz et al. ........... | 414/744.6 |
| 5,195,862 A | * | 3/1993 | Cruz ..................... | 414/416.03 |
| 5,336,029 A | * | 8/1994 | Kato et al. .................. | 414/217 |
| 5,552,932 A | * | 9/1996 | Schultz ....................... | 118/715 |
| 5,605,574 A | * | 2/1997 | Tsunashima et al. ........ | 118/500 |
| 5,679,055 A | * | 10/1997 | Greene et al. ................ | 451/10 |
| 5,695,817 A | | 12/1997 | Tateyama et al. | |
| 5,900,062 A | * | 5/1999 | Loewenhardt et al. .. | 118/723 R |
| 5,967,159 A | * | 10/1999 | Tateyama ..................... | 134/61 |
| 5,989,346 A | * | 11/1999 | Hiroki ......................... | 118/719 |
| 6,048,162 A | * | 4/2000 | Moslehi .................... | 414/744.6 |
| 6,152,677 A | * | 11/2000 | Tateyama et al. ........... | 414/738 |
| 6,193,807 B1 | * | 2/2001 | Tateyama et al. .............. | 134/2 |
| 6,481,951 B1 | * | 11/2002 | Shanmugasundram et al. .. | 414/752.1 |
| 6,502,877 B2 | * | 1/2003 | Schick et al. ................. | 294/65 |

FOREIGN PATENT DOCUMENTS

JP 05152266 A * 6/1993 ......... H01L/21/304

* cited by examiner

*Primary Examiner*—James W. Keenan
(74) *Attorney, Agent, or Firm*—Oblon, Spivak, McClelland, Maier & Neustadt, P.C.

(57) ABSTRACT

A substrate transfer apparatus capable of preventing contaminants from sticking to a substrate again when the substrate is unloaded, wherein a first support member and a second support member are provided on an arm, the first support member supporting the substrate when the substrate is loaded into a processing machine and the second support member supporting the substrate when the substrate is unloaded from the processing machine.

2 Claims, 12 Drawing Sheets

APPARATUS FOR AND METHOD OF TRANSFERRING SUBSTRATES

This application is a division of application of application Ser. No. 09/075,927 filed on May 12, 1998, now U.S. Pat. No. 6,152,677.

BACKGROUND OF THE INVENTION

This invention relates to an apparatus for and method of transferring substrates, such as semiconductor wafers or LCD (Liquid-Crystal Display) glass substrates, between a cassette and a processing section.

In general, photolithography has been used to form circuit or electrode patterns on a substrate, such as a glass substrate, in the manufacture of liquid-crystal displays (LCDs). In photolithography, a series of processes is performed. The processes include cleaning a substrate, drying the substrate, forming a resist film on the substrate, exposing the resist film, and developing the resist film. In the processing units which carry out the processes, a substrate taken out of a cassette in a cassette station and placed on an arm is transferred to the processing sections, which subject the substrate to a series of processes, including the cleaning of the substrate. The substrate passed through the processing sections is put on the arm again and returned to the cassette.

At the top face of the arm, for example, when the section that supports the substrate before cleaning is the same as the section that supports the substrate after the cleaning, the following problem arises: the contaminants on the back of the substrate stick to the support member via the top face of the arm when the uncleaned substrate is put on the arm, which permits the contaminants to stick to the back of the cleaned substrate again when the cleaned substrate is placed on the arm and transferred. As means for solving the problem, a substrate transfer apparatus has been disclosed in, for example, Jpn. Pat. Appln. KOKAI Publication No. 5-152266. With the substrate transfer apparatus in Jpn. Pat. Appln. KOKAI Publication No. 5-152266, a substrate takeout arm which takes an uncleaned substrate out of a cassette and transfers it to the cleaning section is constructed of one unit and a cleaned-substrate storage arm which returns the substrate cleaned in the cleaning section to the cassette is constructed of a separate unit. This prevents contaminants from sticking to the substrate again.

With the substrate takeout arm and cleaned-substrate storage arm being constructed of separate units, however, the substrate transfer apparatus has disadvantages in that it requires the takeout arm and storage arm separately and that the driving unit for switching between the takeout arm and storage arm is relatively large and therefore the configuration is complicated. Furthermore, there is another problem: the turning of the entire arm accompanying the switching action requires a substantially wide space, which prevents effective use of the apparatus installation space.

BRIEF SUMMARY OF THE INVENTION

The object of the present invention is to provide a substrate transfer apparatus with a simple configuration capable of reliably preventing contaminants from sticking to a substrate again and a method of transferring substrates which features the same effect.

According to the present invention, there is provided a substrate transfer apparatus comprising an arm having a top face on which a substrate is placed and first and second support means for selectively supporting the substrate, and a driving section for moving the arm to load and unload the substrate into and from a processing machine, with the substrate kept on the arm.

With the substrate transfer apparatus, when an unprocessed substrate is unloaded from a cassette and transferred to the processing section, for example, the first support members are used support the bottom surface of the substrate, whereas when the substrate processed in the processing section is returned to the cassette, the second support members are used to support the bottom surface of the substrate. In this way, contaminants are easily prevented from sticking to the substrate again by causing one support member to support the unprocessed substrate and the other support member to support the processed substrate on the same arm.

According to the present invention, there is provided a substrate transfer apparatus comprising an arm having a top face on which a substrate is placed and first and second support means for selectively expanding outward to support the substrate, and a pressure adjusting section for selectively causing the first support means and the second support means to expand outward, and a driving section for moving the arm to load and unload the substrate into and from a processing machine, with the substrate kept on the arm.

According to the present invention, there is provided a substrate transfer apparatus comprising an arm having a top face on which a substrate is placed, first and second suction pads which are provided on the top face of the arm in such a manner that they can go up and down freely to selectively suck the substrate, a lift unit for selectively raising and lowering the first and second suction pads, and a driving section for moving the arm to load and unload the substrate into and from a processing machine, with the substrate kept on the arm.

According to the present invention, there is provided a substrate transfer method comprising providing first and second support members for selectively supporting a substrate on the top face of an arm on which the substrate is placed, causing only the first support members to support the substrate and loading the substrate into a processing section, and causing only the second support members to support the substrate and unloading the substrate from the processing section.

With the present invention, it is possible to cause the first support members to support the unprocessed substrate and the second support members to support the processed substrate by switching the support members without moving the arm itself. This enables the relatively simple substrate transfer apparatus to positively solve the problem of contaminants sticking to the processed substrate again. The compact design of the substrate transfer apparatus makes it possible to made effective use of the space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
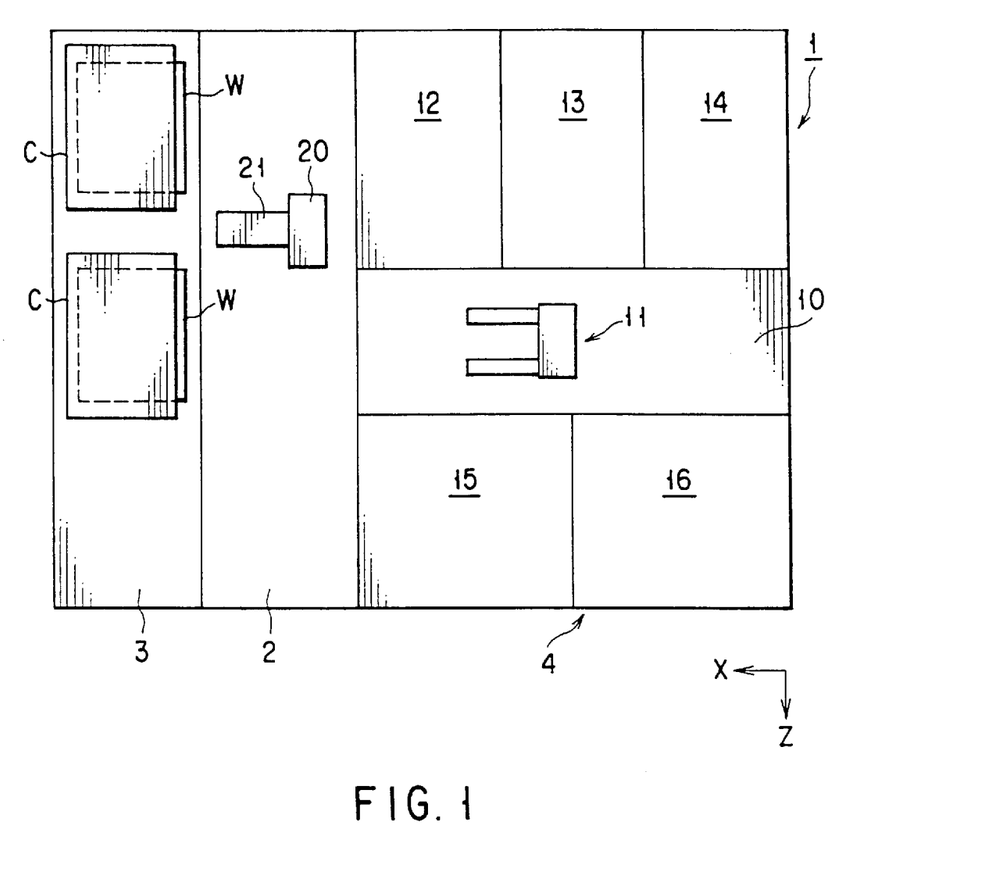
FIG. 1 is a plan view of a cleaning machine.

Hereinafter, preferable embodiments of the present invention will be explained using a cleaning machine 1 which cleans a substrate W, an object to be processed. FIG. 1 is a plan view of a cleaning machine for cleaning a substrate W, such as a semiconductor wafer or an LCD glass substrate. The cleaning machine 1 is provided with a substrate transfer apparatus 2 according to an embodiment of the present invention. On both sides of the substrate transfer apparatus 2, a cassette station 3 and a cleaning section 4 are provided in such manner that they face each other.

On the cassette station 3, cassettes C loaded by a transfer robot (not shown) are placed. Each cassette C houses substrates W, with the substrates arranged horizontally in parallel with each other at specific intervals. The substrates W are, for example, disk-like semiconductor wafers or rectangular LCD glass substrates.

In the middle of a cleaning section 4, a transfer path 10 is formed. A main transfer arm 11 is designed to move along the transfer path 10. In FIG. 1, on one side of the transfer path 10, there are provided scrubber units 15 and 16 for cleaning a substrate W by scrubbers using various agent solutions, such as demineralized water, ammonia water, hydrogen peroxide solution, and hydrogen fluoride solution. On the other side of the transfer path 10, there are provided drying units 12, 13, and 14 for drying the substrate W. As the main transfer arm 11 moves along the transfer path 10, it transfers the substrate W to the individual units 12 to 16 in specific order, thereby subjecting the substrate to each cleaning process.

The substrate transfer apparatus 2 includes an arm 21 provided on the front of a base 20. As described below, in the substrate transfer apparatus 2, the base 20 is designed to move in the directions of X and Y shown in FIG. 1, go up and down vertically, and rotate on a vertical axis. As the base 20 moves, an uncleaned substrate W is taken out of a cassette C on the cassette station 3, put on the arm 21, and transferred. The substrate W is delivered to the main transfer arm 11 of the cleaning section 4. At the same time, a substrate W already cleaned at the cleaning section 4 is received from the main transfer arm 11 and put on the arm 21. Then, the substrate W is transferred and returned to the cassette C on the cassette station 3.

Figure 2:
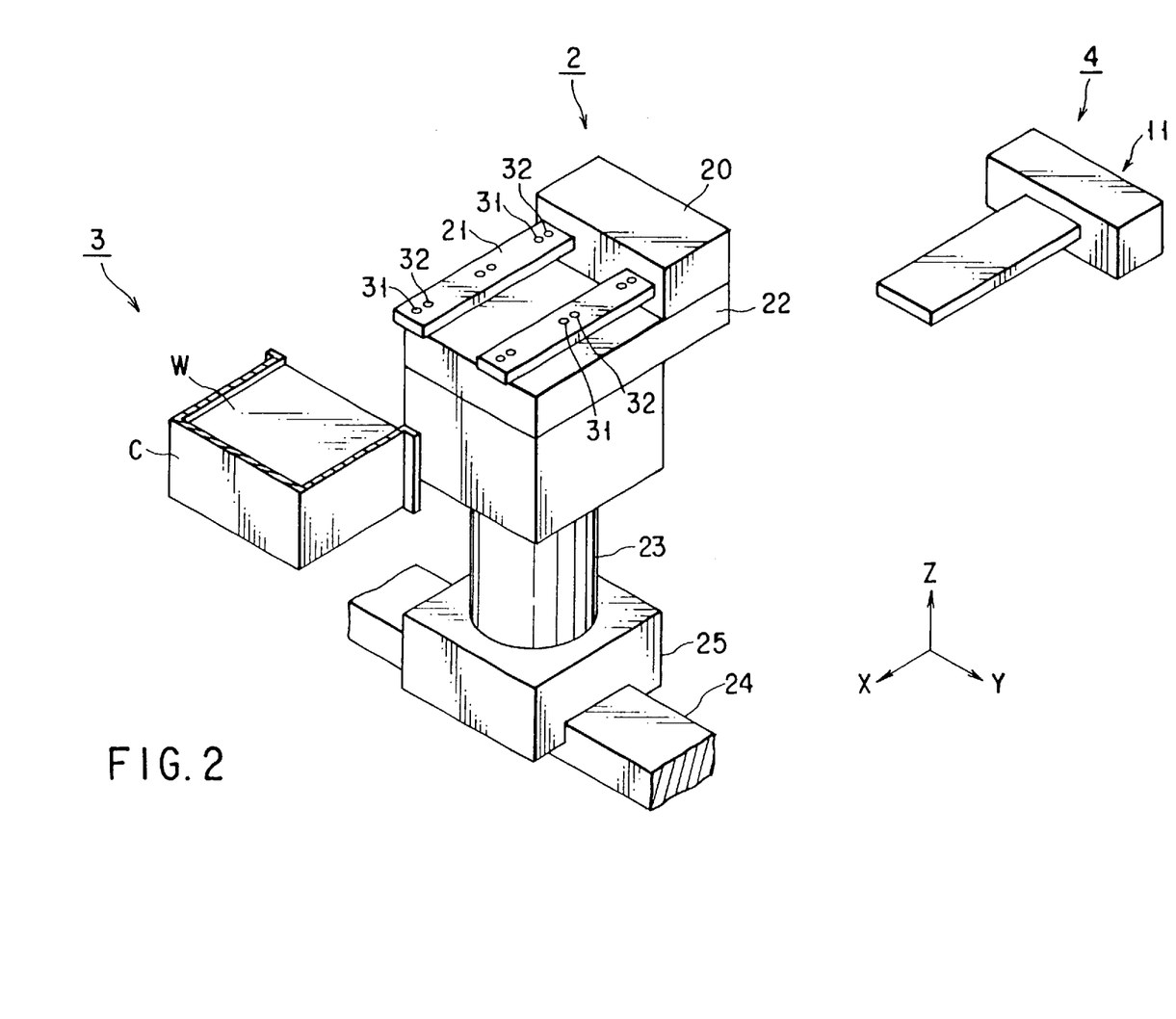
FIG. 2 is a perspective view of a substrate transfer apparatus according to an embodiment of the present invention.

The base 20 is supported by an advance/retreat unit 22 for advancing and retreating the arm 21 with respect to the cassette C by moving the base 20 horizontally along the X-axis in the posture of FIG. 2, a rotate/lift unit for causing the arm 21 to rotate and go up and down by supporting the bottom of the advance/retreat unit 22 in such a manner that the unit 22 can rotate and go up and down freely, and a lateral movement unit 25 for moving the arm 21 in a lateral direction by supporting the lower part of the rotate/lift unit and moving along a rail 24 provided in the direction of Y-axis. With the advance/retreat unit 22, a rotation/lift unit 23, and a lateral movement unit 25 moving in cooperation with each other, the arm 21 is raised while it is kept inserted in the cassette C placed on the cassette station 3, thereby taking an uncleaned substrate W out of the cassette C. The taken-out substrate W is put on the arm 21 and transferred to the main transfer arm 11 of the cleaning section 4 standing by at the back of the substrate transfer apparatus 2. When a substrate W already cleaned at the cleaning section 4 is returned to the cassette C, the main transfer arm 11 places the substrate W on the arm 21. Thereafter, the substrate W is transferred while being kept on the arm 21 and is returned to the cassette C on the cassette station 3. On the top face of the arm 21, first support members 31 and second support members 32 are provided in at least three or more places. A concrete structure will be explained later. The first support member 31 and second support member 32 are designed to switch between a state where only the first support members 31 support support the bottom surface of the substrate W at the top face of the arm 21 without permitting the second support members 32 to touch the substrate and a state where only the second support members 32 support the bottom surface of the substrate W at the top face of the arm 21 without permitting the first support members 31 to touch the substrate.

Figure 3:
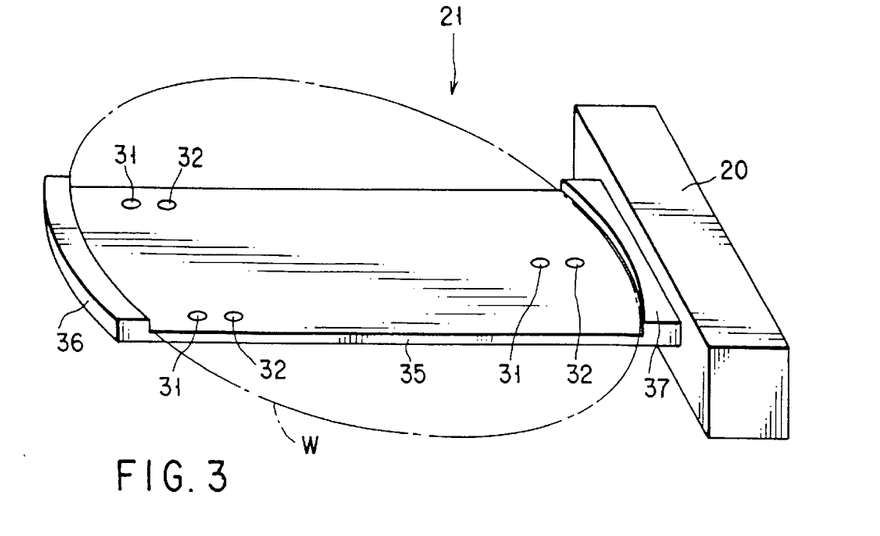
FIG. 3 is a perspective view of an arm suitable for transferring a substrate, such as a semiconductor wafer.

FIG. 3 is a perspective view of an arm 21 suitable for transferring a substrate W, such as a disk-like semiconductor wafer. As shown in FIG. 3, the arm 21 is constructed of a single plate member 35 provided on the front of the base 20. On the top of the plate member 35, a set of the first support members 31 and the second support members 32 are placed in three places. Guides 36 and 37 for positioning the periphery of a substrate W, such as a semiconductor wafer, are provided at the tip end and neck end of the plate member 35, respectively. The arm 21 is constructed in such a manner that it can switch between a state where only the first support members 31 support, at the top of the plate member 35, the bottom surface of the substrate W positioned between the guides 36 and 37 and a state where only the second support members 32 support the bottom surface of the substrate W.

Figure 4:
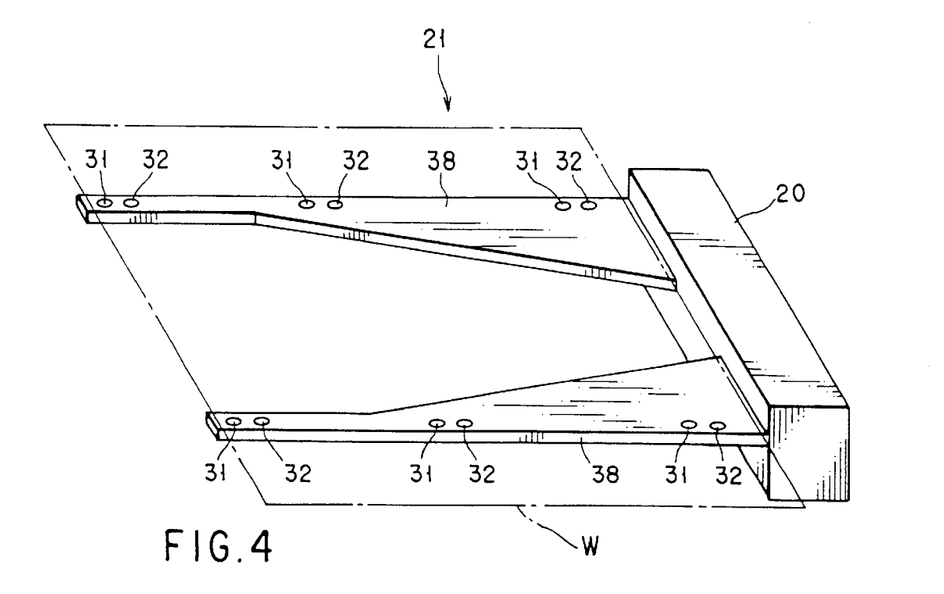
FIG. 4 is a perspective view of an arm suitable for transferring a substrate, such as an LCD glass substrate.

FIG. 4 shows an arm 21 suitable for transferring a substrate W, such as a rectangular LCD glass substrate. As in the figure, the arm 21 has two arm members 38 provided on the front of the base 20. On the top of each plate member 38, a set of the first support members 31 and the second support members 32 are placed in three places. That is, a total of six sets of the first and second support members are provided. On the top of the two arm members 38, the state where only the first support members 31 support the bottom surface of the substrate W is switched to the state where only the second support members 32 support the bottom surface of the substrate W or vice versa.

As described above, the shape of the arm 21 can be constructed of, for example, a single plate member 35 or two arm members 38. A set of the first support member 31 and second support member 32 has only to be provided in at least three or more places on the top face of the arm 21 so that the bottom surface of the substrate W may be supported stably.

In the cleaning machine 1 of FIG. 1, the cassette C loaded by the transfer robot is placed on the cassette station 3. In the cassette C, uncleaned substrates W are arranged in parallel at more than one stage.

Then, the arm 21 of the substrate transfer apparatus 2 starts to take a substrate W out of the cassette C. To take an uncleaned substrate W out of the cassette C, the arm 21 is brought into a state where only the first support member 31 can support the bottom surface of the substrate W at the top face of the arm 21. With the advance/retreat unit 22, rotate/lift unit 23, and lateral movement unit 25 moving in cooperation with each other as explained in FIG. 2, the arm 21 is moved and inserted into the cassette C on the cassette station 3 and then is raised. This causes only the first support members 31 to support the bottom surface of the substrate W housed in the cassette C. The arm 21 then receives the substrate W as if to scoop the substrate from below. The substrate W received on the arm 21 this way is taken out of the cassette C.

With the bottom surface of the substrate W taken out this way being supported by only the first support members 31 above the arm 21, the cooperative action of the advance/retreat unit 22, rotate/lift unit 23, and lateral movement unit 25 transfers the substrate W and delivers it to the main transfer arm 11 of the cleaning section 4 standing by at the back of the substrate transfer apparatus 2. The movement of the main transfer arm 11 transfers the delivered substrate W to each of the units 12 to 16 in the cleaning section 4 in specific order. The units subject the substrate W to various cleaning processes. After the subject W has been cleaned in the cleaning section 4, it is placed on the main transfer arm 11 of the cleaning section 4 and brought into the standby state at the back of the substrate transfer apparatus 2.

To return the substrate W cleaned at the cleaning section 4 to the cassette C, the arm 21 is brought into a state where only the second support members 32 supports the bottom surface of the substrate W at the top face of the arm 21. The cooperative action of the advance/retreat unit 22, rotate/lift unit 23, and lateral movement unit 25 moves the arm 21 and positions it below the substrate W on the main transfer arm 11 standing by at the back of the substrate transfer apparatus 2. Thereafter, the arm 21 is raised. In this way, the bottom surface of the substrate W on the main transfer arm 11 is supported by only the second support member 32. Then, the substrate W is scooped from below and delivered onto the arm 21.

The cooperative action of the advance/retreat unit 22, rotate/lift unit 23, and lateral movement unit 25 moves the art 21, thereby transferring the substrate W on the arm 21, which returns the substrate W to the cassette C.

After all the substrates W in the cassette C have been cleaned by the repetition of the aforementioned processes, the transfer robot unloads the cassette C from the cassette station 3.

As described above, with the substrate transfer apparatus 2, when a substrate W is transferred between a cassette C on the cassette station 3 and the main transfer arm 11 of the cleaning section 11, an uncleaned substrate W is supported by only the first support members 31 and the cleaned substrate W is supported by only the second support members 32. Therefore, even if contaminants on the bottom surface of the uncleaned substrate W stick to the first support members 31, there is no fear that they will stick again to the cleaned substrate W. Furthermore, in the substrate transfer apparatus 2, even when an uncleaned substrate W is supported by only the second support members 32 and transferred from the cassette C to the main transfer arm 11 and the cleaned substrate W is supported by only the first support members 31 and transferred from the main transfer arm 11 to the cassette C, contaminants will be similarly prevented from sticking to the substrate again.

Hereinafter, a concrete configuration of the first support members 31 and second support members 32 will be explained. They are used suitably in the substrate transfer apparatus 2 of the present invention.

Figure 5:
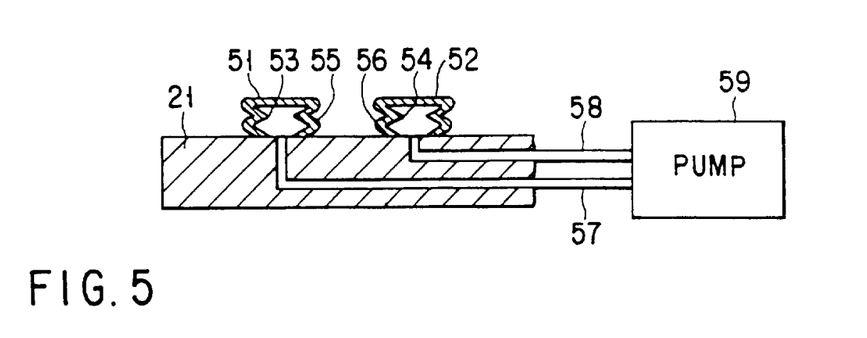
FIG. 5 is a sectional view of an arm where a fluid reservoir acting as a pressure adjusting section is provided below each of a first support member and a second support member.
Figure 8:
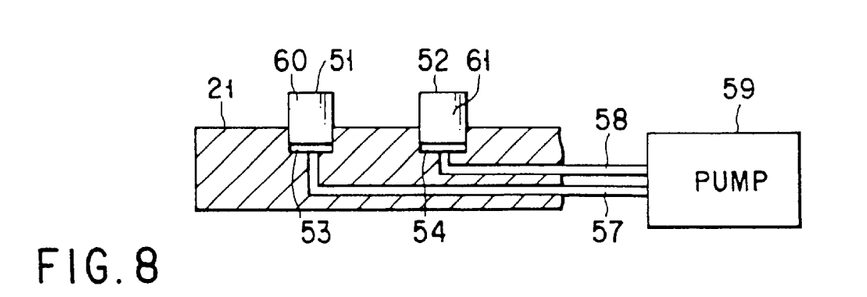
FIG. 8 is a sectional view of an arm where a fluid reservoir acting as a pressure adjusting section is provided below each of a first support member and a second support member, which are each constructed of a piston capable of moving up and down.
Figure 11:
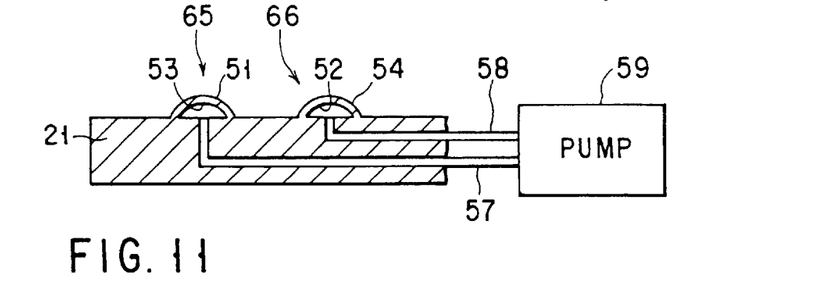
FIG. 11 is a sectional view of an arm where a fluid reservoir acting as a pressure adjusting section is provided below each of a first support member and a second support member, which are each constructed of a bag-like expanding member.

FIGS. 5, 8, and 11 show embodiments in each of which fluid reservoirs 53 and 54 acting as pressure adjusting sections are provided below a first support member 51 and second support member 52 located on the top face of the arm 21, respectively. In FIGS. 5, 8, and 11, although only one first support member 51 and only one second support member 52 are shown to simplify the explanation, at least three sets of the first support member 51 and the second support member 52 are provided on the top face of the arm 21.

The first support member 51 and second support member 52 in FIG. 5 are constructed by the top ends of bellows-like elastic cases 55 and 56, respectively. The arm 21 is constructed in such a manner that fluid, such as air, can be supplied via circuits 57 and 58 to the fluid reservoirs 53 and 54 serving as pressure adjusting sections in the elastic cases 55 and 56. In this case, the fluid is selectively sent from, for example, a pump 59 provided in the base 20 to the circuit 57 or 58.

Figure 6:
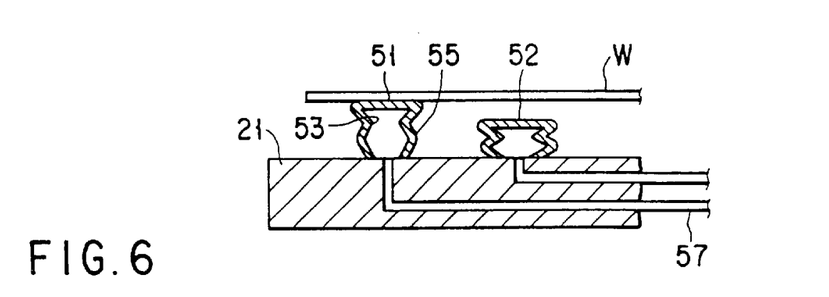
FIG. 6 is a sectional view to help explain a state where an uncleaned substrate is transferred in the embodiment of FIG. 5.
Figure 7:
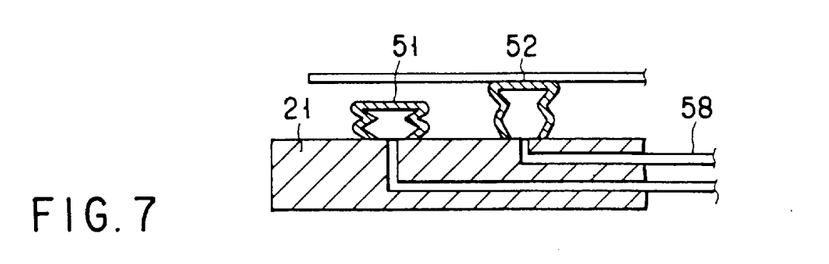
FIG. 7 is a sectional view to help explain a state where a cleaned substrate is transferred in the embodiment of FIG. 5.

With such a configuration, when an uncleaned substrate W is transferred while being kept on the arm 21, the supply of the fluid via the circuit 57 to the fluid reservoir 53 causes the elastic case 55 to expand upward, making the first support member 51 higher than the second support member 52 as shown in FIG. 6. As a result, the bottom surface of the substrate W is supported by only the first support member 51. When the cleaned substrate W is transferred, the supply of the fluid via the circuit 58 to the fluid reservoir 54 causes the elastic case 56 to expand upward, making the second support member 52 higher than the first support member 51, as shown in FIG. 7. As a result, the bottom surface of the substrate W is supported by only the second support member 52.

Figure 9:
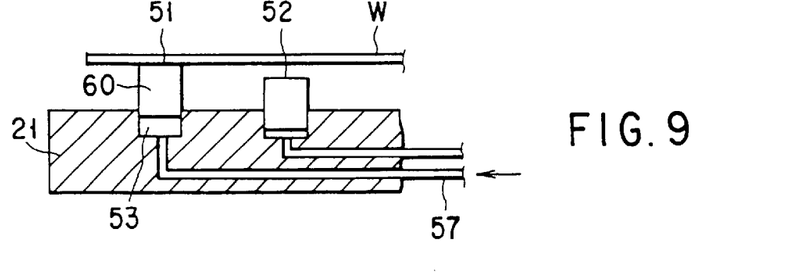
FIG. 9 is a sectional view to help explain a state where an uncleaned substrate is transferred in the embodiment of FIG. 8.
Figure 10:
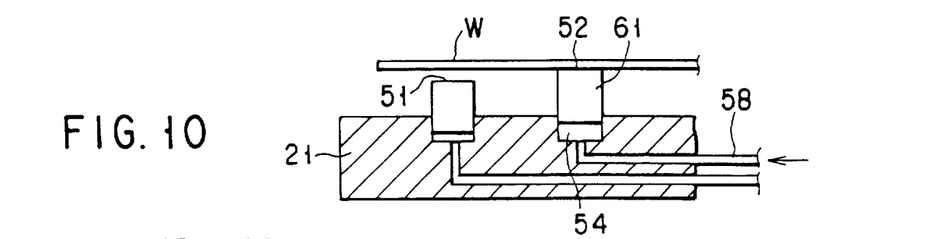
FIG. 10 is a sectional view to help explain a state where a cleaned substrate is transferred in the embodiment of FIG. 8.

The first support member 51 and second support member 52 in FIG. 8 are constructed by the top ends of vertical-movement pistons 60 and 61, respectively. The arm 21 is constructed in such a manner that fluid, such as air, can be supplied via circuits 57 and 58 to the fluid reservoirs 53 and 54 serving as pressure adjusting sections formed at the lower ends of the pistons 60 and 61. With such a configuration, when an uncleaned substrate W is transferred while being kept on the arm 21, the supply of the fluid via the circuit 57 to the fluid reservoir 53 causes the piston 60 to rise, making the first support member 51 higher than the second support member 52 as shown in FIG. 9. As a result, the bottom surface of the substrate W is supported by only the first support member 51. When the cleaned substrate W is transferred, the supply of the fluid via the circuit 58 to the fluid reservoir 54 causes the piston 61 to rise, making the second support member 52 higher than the first support member 51, as shown in FIG. 10. As a result, the bottom surface of the substrate W is supported by only the second support member 52.

Figure 12:
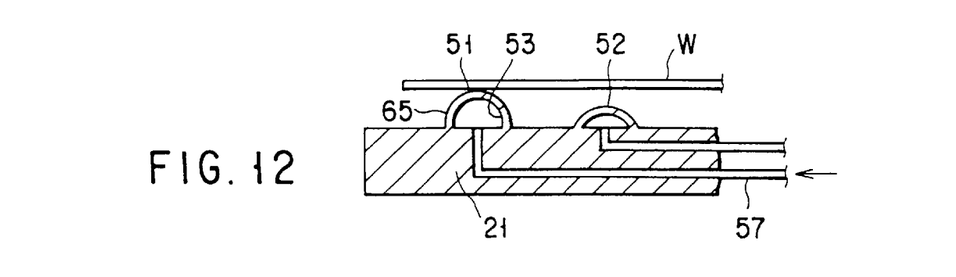
FIG. 12 is a sectional view to help explain a state where an uncleaned substrate is transferred in the embodiment of FIG. 11.
Figure 13:
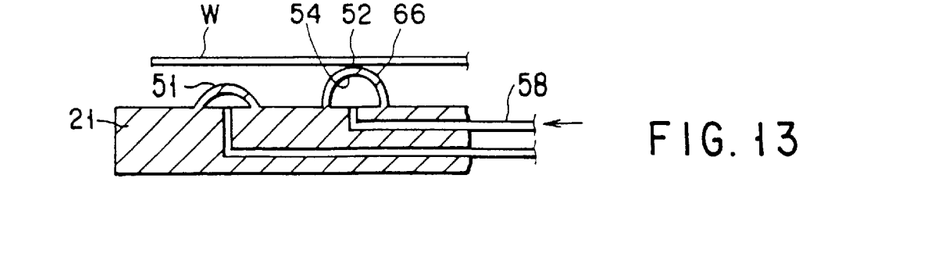
FIG. 13 is a sectional view to help explain a state where a cleaned substrate is transferred in the embodiment of FIG. 11.
Figure 15:
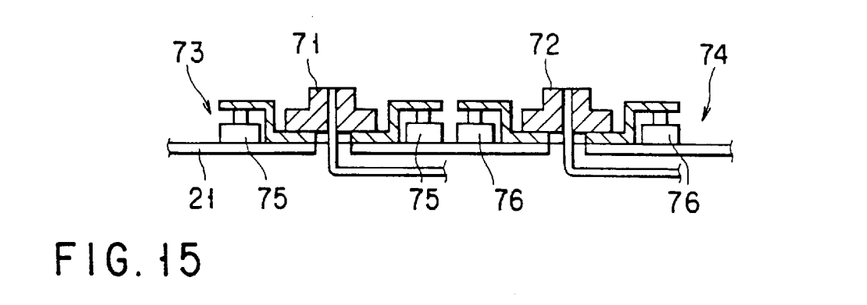
FIG. 15 is a sectional view of an embodiment where a cylinder is used as a lift unit.

The first support member 51 and second support member 52 in FIG. 11 are constructed by the top ends of bag-like expanding members 65 and 66 provided on the top face of the arm 21, respectively. The arm 21 is constructed in such a manner that fluid, such as air, can be supplied via circuits 57 and 58 to the fluid reservoirs 53 and 54 serving as pressure adjusting sections in the expanding members 65 and 66. With such a configuration, when an uncleaned substrate W is transferred while being kept on the arm 21, the supply of the fluid via the circuit 57 to the fluid reservoir 53 causes the expanding member 65 to expand upward, making the first support member 51 higher than the second support member 52 as shown in FIG. 12. As a result, the bottom surface of the substrate W is supported by only the first support member 51. When the cleaned substrate W is transferred, the supply of the fluid via the circuit 58 to the fluid reservoir 54 causes the expanding member 66 to expand upward, making the second support member 52 higher than the first support member 51, as shown in FIG. 15. As a result, the bottom surface of the substrate W is supported by only the second support member 52.

With the embodiments shown in FIGS. 5, 8, and 11, too, the contaminants stuck from the uncleaned substrate W to the first support member 51 are prevented from sticking to the cleaned substrate W again by switching the support member that supports the bottom surface of the substrate W from the first support member 51 to the second support member 52 after the cleaning. An uncleaned substrate W may be supported by only the second support member 52 and the cleaned substrate W be supported by only the first support member 51. Similarly with the embodiments shown in FIGS. 5, 8, and 11, the substrate transfer apparatus may be constructed as follows. A depressurizing chamber acting as a depressurizing section is provided below each of the first support member 51 and second support member 52 (instead of the fluid reservoirs 53 and 54 acting as pressure adjusting sections). In a state where the depressurizing chamber below the first support member 51 is depressurized, the second support member 52 is higher than the first support member 51, whereas in a state where the depressurizing chamber below the second support member 52 is depressurized, the first support member 51 is higher than the second support member 52.

Figure 14:
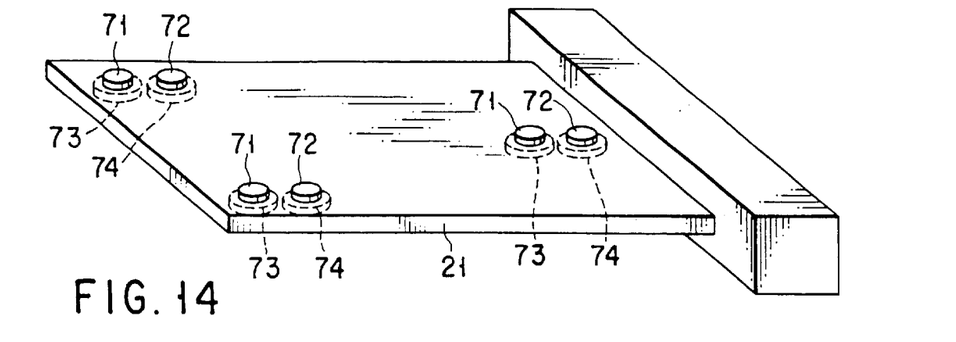
FIG. 14 is a perspective view of an embodiment where a first suction pad and a second suction pad are supported by a lift unit.

FIG. 14 illustrates an embodiment where a set of a first suction pad 71 and a second suction pad 72 is provided in three or more places on the top face of the arm 21. The first suction pad 71 and second suction pad 72 are supported by lift units 73 and 74, respectively.

Figure 16:
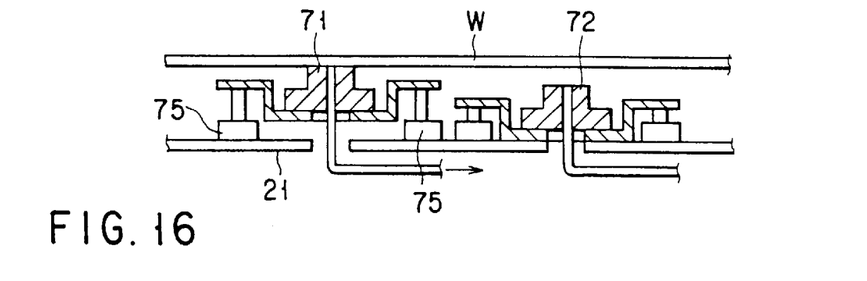
FIG. 16 is a sectional view to help explain a state where an uncleaned substrate is transferred in the embodiment of FIG. 15.
Figure 17:
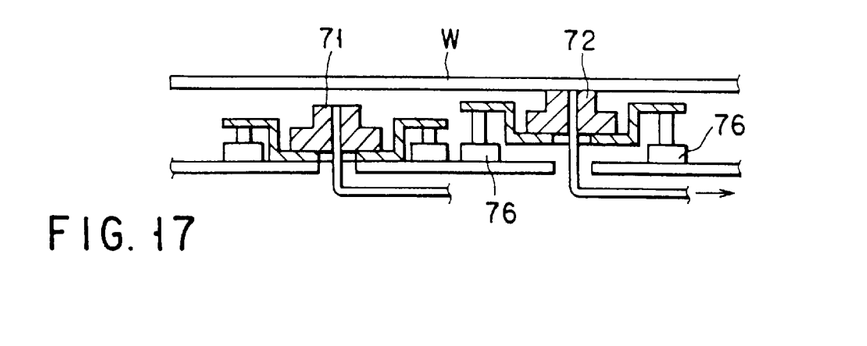
FIG. 17 is a sectional view to help explain a state where a cleaned substrate is transferred in the embodiment of FIG. 15.

FIG. 15 shows an embodiment where the lift units 73 and 74 are constructed by cylinders 75 and 76, such as pneumatic cylinders or hydraulic cylinders. In this embodiment, when an uncleaned substrate W is transferred while being kept on the arm 21, the expansion of the cylinder 75 causes the first suction pad 71 to rise, making the first suction pad 71 higher than the second suction pad 72, as shown in FIG. 16. As a result, the bottom surface of the substrate W is sucked by only the first suction pad 71. When the cleaned substrate W is transferred, the expansion of the cylinder 76 causes the second suction pad 72 to rise, making the second suction pad 72 higher than the first suction pad 71. As a result, the bottom surface of the substrate W is sucked by only the second suction pad 72.

Figure 18:
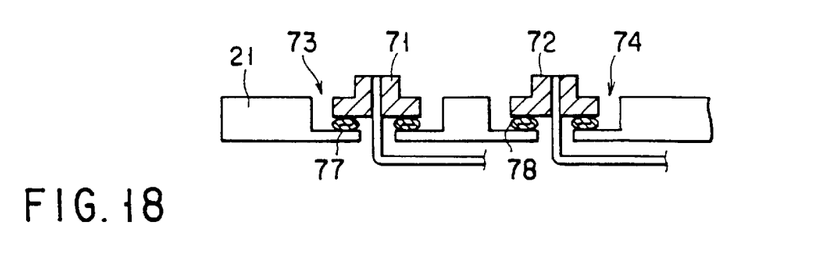
FIG. 18 is a sectional view of an arm using, as the lift unit, bag members that expand from the supply of fluid to raise the first suction pad and second suction pad.
Figure 19:
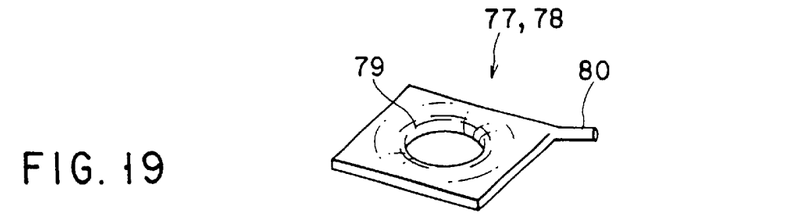
FIG. 19 is a perspective view of one bag member.
Figure 20:
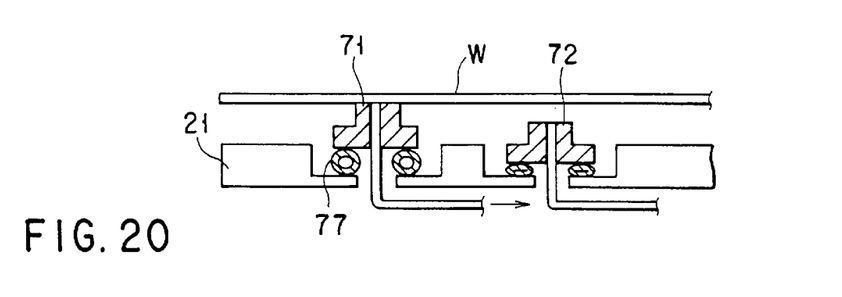
FIG. 20 is a sectional view to help explain a state where an uncleaned substrate is transferred in the embodiment of FIG. 18.
Figure 21:
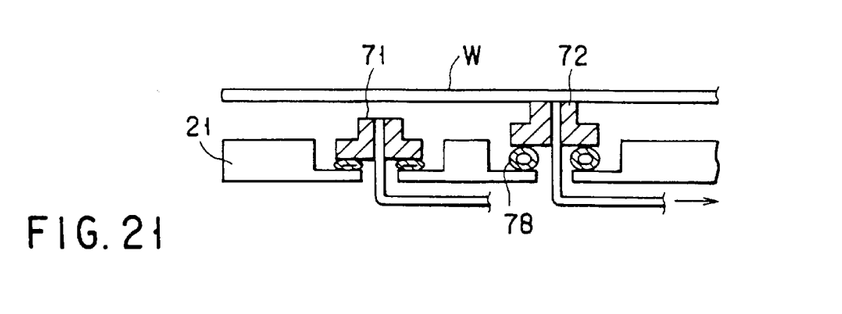
FIG. 21 is a sectional view to help explain a state where a cleaned substrate is transferred in the embodiment of FIG. 18.

FIG. 18 shows an embodiment where the lift units 73 and 74 are constructed by bag members 77 and 78 which are provided between the arm 21 and the first suction pad 71 and second suction pad 72 and expand as a result of a selective supply of fluid from a pump, thereby raising the first suction pad 71 and second suction pad 72. As shown in FIG. 19, each of the bag members 77 and 78 takes the form of a sealed bag having an opening section 79 in the middle. The bag members 77 and 78 are expanded by introducing, for example, air from their inlets 80. In the embodiment, when an uncleaned substrate W is transferred while being kept on the arm 21, the supply of fluid to the bag member 77 expands the bag member 77, causing the first suction pad 71 to rise, which makes the first suction pad 71 higher than the second suction pad 72, as shown in FIG. 20. As a result, the bottom surface of the substrate W is sucked by only the first suction pad 71. When the cleaned substrate W is transferred, the supply of fluid to the bag member 78 expands the bag member 78, causing the second suction pad 72 to rise, which makes the second suction pad 72 higher than the first suction pad 71, as shown in FIG. 21. As a result, the bottom surface of the substrate W is sucked by only the second suction pad 72.

Figure 22:
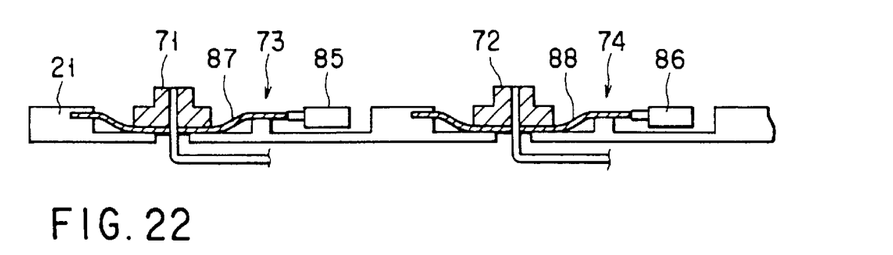
FIG. 22 is a sectional view of an arm using, as the lift unit, strap members that are strained to raise the first suction pad and second suction pad.
Figure 23:
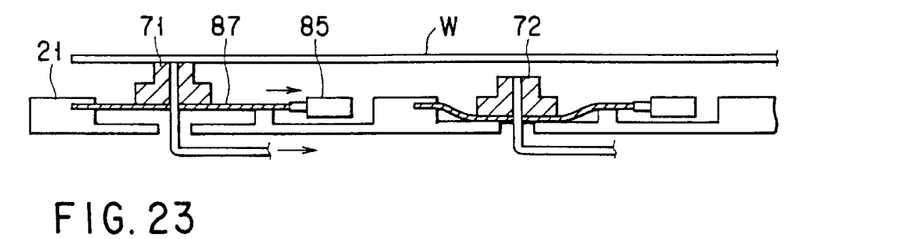
FIG. 23 is a sectional view to help explain a state where an uncleaned substrate is transferred in the embodiment of FIG. 22.
Figure 24:
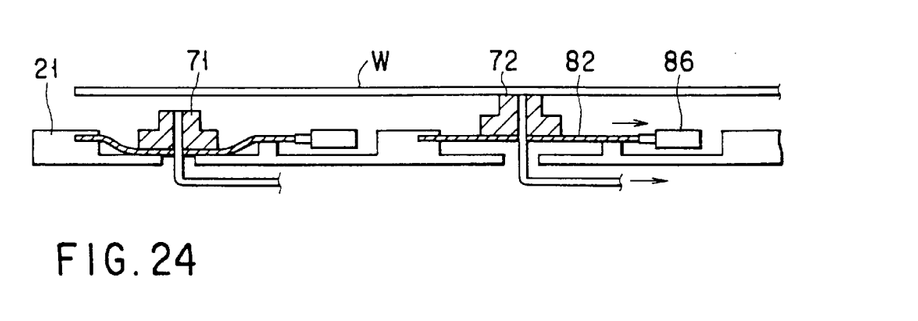
FIG. 24 is a sectional view to help explain a state where a cleaned substrate is transferred in the embodiment of FIG. 22.

FIG. 22 shows an embodiment where the lift units 73 and 74 are constructed by strap members 87 and 88 which are provided below the first suction pad 71 and second suction pad 72 and are strained as a result of the contraction of cylinders 85 and 86, thereby causing the first suction pad 71 and second suction pad 72 to rise. In FIG. 22, both of the cylinders 85 and 86 expand, relaxing both of the strap members 87 and 88, which allows both of the first suction pad 71 and second suction pad 72 to go down by their own weight. In the embodiment, when an uncleaned substrate W is transferred while being kept on the arm 21, the contraction of the cylinder 85 strains the strap member 87 to raise the first suction pad 71, making the first suction pad 71 higher than the second suction pad 72, as shown in FIG. 23. As a result, the bottom surface of the substrate W is sucked by only the first suction pad 71. When the cleaned substrate W is transferred, the contraction of the cylinder 86 strains the strap member 88 to raise the second suction pad 72, making the second suction pad 72 higher than the first suction pad 71, as shown in FIG. 24. As a result, the bottom surface of the substrate W is sucked by only the second suction pad 72.

Figure 25:
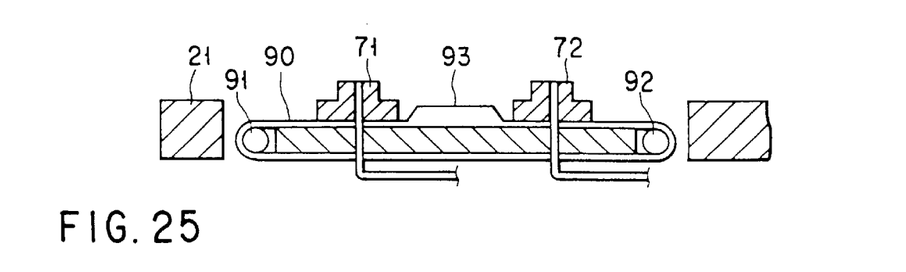
FIG. 25 is a sectional view of an arm using, the lift unit, a belt inserted below the first suction pad and second suction pad.
Figure 26:
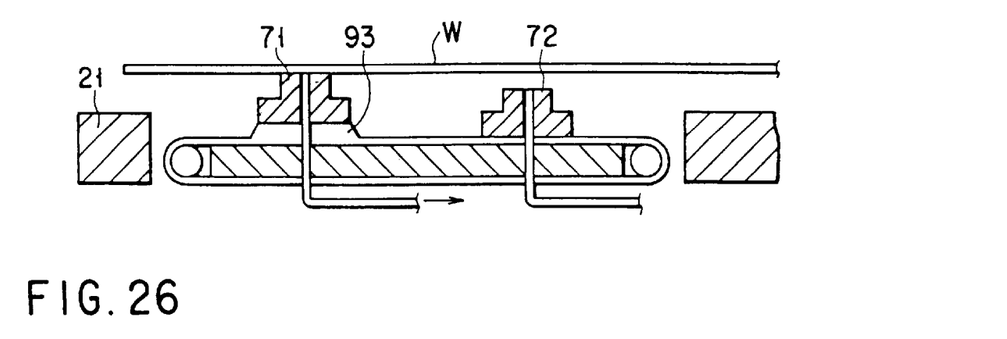
FIG. 26 is a sectional view to help explain a state where an uncleaned substrate is transferred in the embodiment of FIG. 23.
Figure 27:
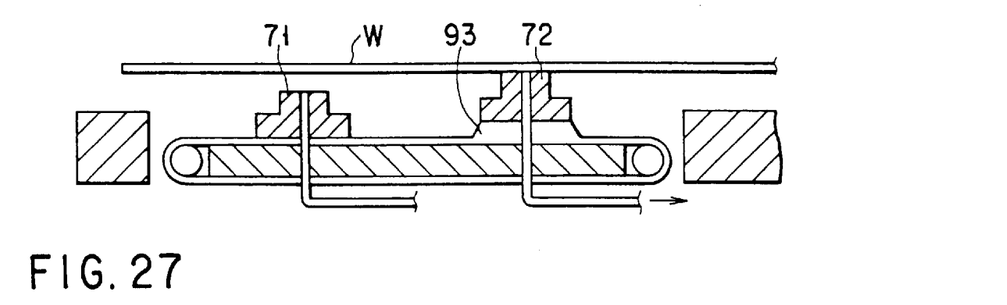
FIG. 27 is a sectional view to help explain a state where a cleaned substrate is transferred in the embodiment of FIG. 23.

FIG. 25 shows an embodiment where the lift units 73 and 74 are constructed by a belt 90 provided below the first suction pad 71 and second suction pad 72. The belt 90 is stretched over a driving roller 91 and a driven roller 92 both installed on the arm 21 and circulates around them. The belt 90 is provided with a thick section 93 relatively thicker than the other portions. As the belt 90 circulates, the belt 90 switches between a state where the thick section 93 gets under the first suction pad 71 to raise the first suction pad 71 and a state where the thick section 93 gets under the second suction pad 72 to raise the second suction pad 72. In the embodiment, when an uncleaned substrate W is transferred while being kept on the arm 21, the thick section 93 is forced to get under the first suction pad 71 to raise the first suction pad 71, making the first suction pad 71 higher than the second suction pad 71, as shown in FIG. 26. As a result, the bottom surface of the substrate W is sucked by only the first suction pad 71. When the cleaned substrate W is transferred, the thick section 93 is forced to get under the second suction pad 72 to raise the second suction pad 72, making the second suction pad 72 higher than the first suction pad 72, as shown in FIG. 27. As a result, the bottom surface of the substrate W is sucked by only the second suction pad 72.

With the embodiments shown in FIGS. 15, 18, 22, and 25, too, the contaminants stuck from the uncleaned substrate W to the first suction pad 71 are prevented from sticking to the cleaned substrate W again by switching the suction member that sucks the bottom surface of the substrate W from the first suction pad 71 to the second suction pad 72 after the cleaning. The substrate transfer apparatus may be constructed in such a manner that an uncleaned substrate W is sucked by only the second suction pad 72 and the cleaned substrate W is sucked by only the first suction pad 71.

Figure 28:
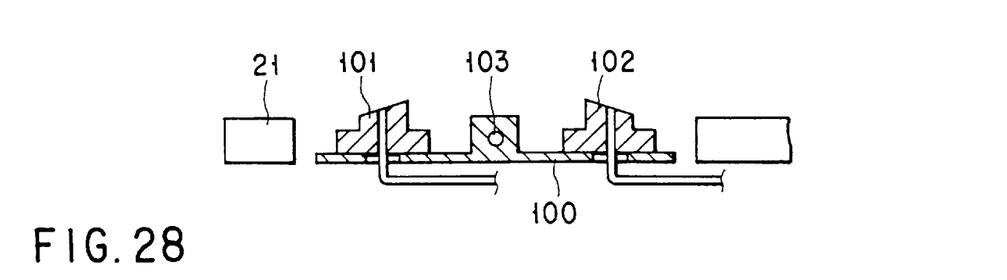
FIG. 28 is a sectional view of an arm where a seesaw-like rocking member is provided in three or more places on the top face of the arm and a first suction pad is installed on one end of the rocking member and a second pad is installed on the other end of the rocking member.

FIG. 28 shows an embodiment where a seesaw-like rocking member 100 is provided on the top face of the arm 21 and has a first suction pad 101 at one end and a second suction pad 102 at the other end. In FIG. 28, although only one rocking member 100, one first suction pad 101, and one second suction pad 102 are shown to simplify the explanation, at least three sets of the rocking member 100, first suction pad 101, and second suction pad 102 are provided on the top face of the arm 21.

The rocking member 100 is provided on a driving shaft 103 rotated by an actuator (not shown). When the rotation of the driving shaft 103 rocks the rocking member 100 clockwise, this makes the first suction pad 101 higher than the second suction pad 102. When the rotation rocks the rocking member 100 counterclockwise, this makes the second suction pad 102 higher than the first suction pad 101.

Figure 29:
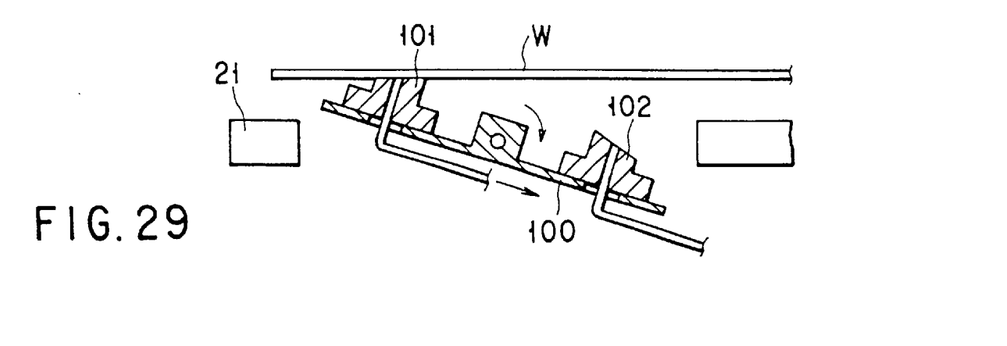
FIG. 29 is a sectional view to help explain a state where an uncleaned substrate is transferred in the embodiment of FIG. 28.
Figure 30:
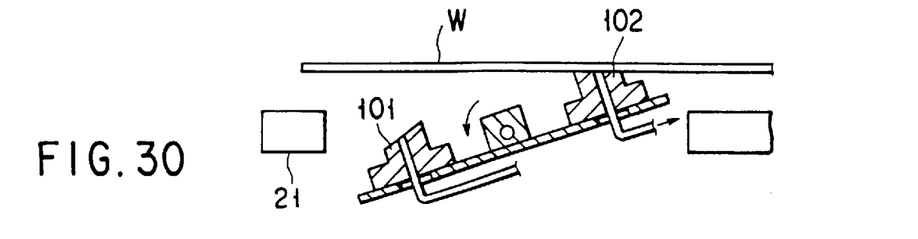
FIG. 30 is a sectional view to help explain a state where a cleaned substrate is transferred in the embodiment of FIG. 28.

In the embodiment, when an uncleaned substrate W is transferred while being kept on the arm 21, the clockwise rocking of the rocking member 100 makes the first suction pad 101 higher than the second suction pad 102, as shown in FIG. 29. As a result, the bottom surface of the substrate W is sucked by only the first suction pad 101. When the cleaned substrate W is transferred, the counterclockwise rocking of the rocking member 100 makes the second suction pad 102 higher than the first suction pad 101. As a result, the bottom surface of the substrate W is sucked by only the second suction pad 102. As described above, the contaminants stuck from the uncleaned substrate W to the first suction pad 101 are prevented from sticking to the cleaned substrate W again by switching the suction member that sucks to the bottom surface of the substrate W from the first suction pad 101 to the second suction pad 102 after the cleaning.

The substrate transfer apparatus may be constructed in such a manner that an uncleaned substrate W is sucked by only the second suction pad 102 and the cleaned substrate W is sucked by only the first suction pad 101. With this configuration, too, the contaminants will be prevented from sticking to the cleaned substrate again.

Figure 31:
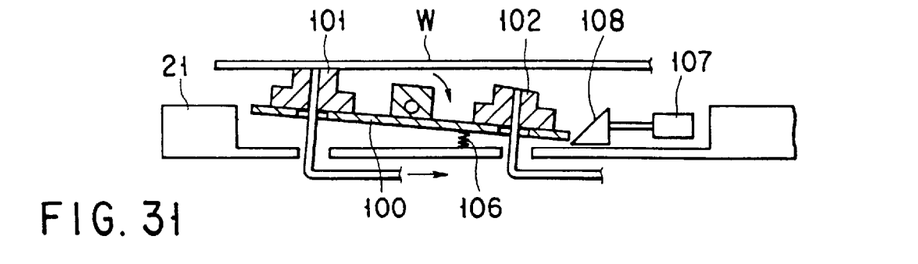
FIG. 31 is a sectional view of an arm where a rocking member is rocked by the pull strength of a spring and a wedge member fitted under the bottom surface of the other side of the rocking member.
Figure 32:
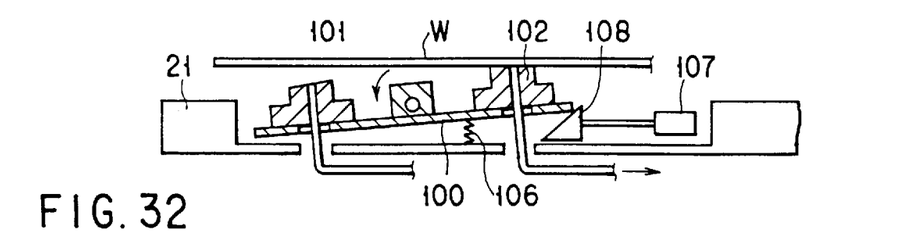
FIG. 32 is a sectional view to help explain a state where a cleaned substrate is transferred in the embodiment of FIG. 31.

FIGS. 31 and 32 show an embodiment where the rocking member 100 is rocked by the pull strength of a spring 106 and a wedge member 108 that gets under the other end of the rocking member 100 as a result of the expansion of a cylinder 107. As with the embodiment explained in FIG. 28, the first suction pad 101 is provided at one end of the rocking member 100 and the second suction pad 102 is provided at the other end.

In the embodiment, when an uncleaned substrate W is transferred while being kept on the arm 21, the contraction of the cylinder 107 removes the wedge member 108 from under the other end of the rocking member 100, allowing the pull strength of the spring 106 to rock the rocking member 100 clockwise, which makes the first suction pad 101 higher than the second suction pad 102, as shown in FIG. 31. As a result, the bottom surface of the substrate W is sucked by only the first suction pad 101. When the cleaned substrate W is transferred, the expansion of the cylinder 107 forces the wedge member 108 to get under the other end of the rocking member 100, rocking the rocking member 100 counterclockwise against the pull strength of the spring 106, which makes the second suction pad 102 higher than the first suction pad 101. As a result, the bottom surface of the substrate W is sucked by only the second suction pad 102. With the embodiment, too, contaminants stuck from an uncleaned substrate W are prevented from sticking to the cleaned substrate W again.

As explained in FIGS. 28 to 32, with the configuration where the rocking of the rocking member 100 switches between the suction by the first suction pad 101 and the suction by the second suction pad 101, when the tops of the first suction pad 101 and second suction pad 102 are tapered in such a manner that the outer edge is lower than the inner edge as shown in the figure, this improves the suction properties between the top of each pad and the bottom surface of the substrate W.

Figure 33:
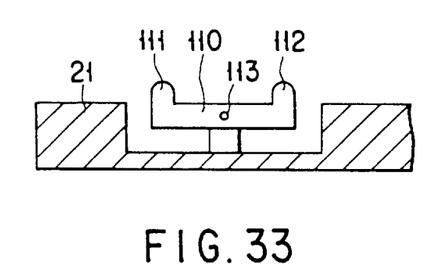
FIG. 33 is a sectional view of an arm where a seesaw-like rocking member is provided on the top face of the arm and a first support member is installed at one end of the rocking member and a second support member is installed at the other end of the rocking member.

FIG. 33 shows an embodiment where a seesaw-like rocking member 110 is provided on the top face of the arm 21 and has a first support member 111 at one end and a second support member 112 at the other end. Although only one rocking member 110, one first support member 111, and one second support member 112 are shown to simplify the explanation, at least three sets of the rocking member 110, first support member 111 and second support member 112 are provided on the top face of the arm 21.

The rocking member 110 is provided on a driving shaft 113 rotated by an actuator (not shown). When the rotation of the driving shaft 113 rocks the rocking member 110 clockwise, this makes the first support member 111 higher than the second support member 112. When the rotation rocks the rocking member 110 counterclockwise, this makes the second support member 112 higher than the first member 111.

Figure 34:
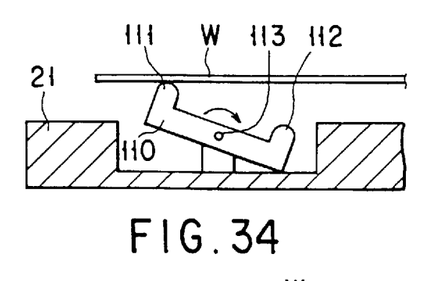
FIG. 34 is a sectional view to help explain a state where an uncleaned substrate is transferred in the embodiment of FIG. 33.
Figure 35:
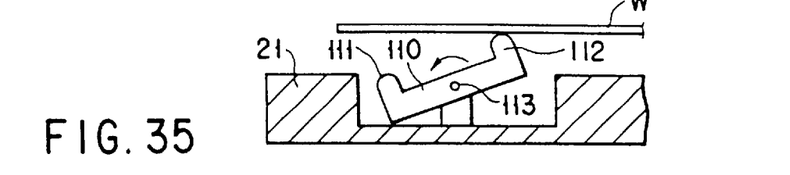
FIG. 35 is a sectional view to help explain a state where a cleaned substrate is transferred in the embodiment of FIG. 33.

In the embodiment, when an uncleaned substrate W is transferred while being kept on the arm 21, the clockwise rocking of the rocking member 110 makes the first support member 111 higher than the second support member 112, as shown in FIG. 34. As a result, the bottom surface of the substrate W is supported by only the first support member 111. When the cleaned substrate W is transferred, the counterclockwise rocking of the rocking member 110 makes the second support member 112 higher than the first support member 111. As a result, the bottom surface of the substrate W is supported by only the second support member 112. As described above, the contaminants stuck from the uncleaned substrate W to the first support member 111 are prevented from sticking to the cleaned substrate W again by switching the support member that supports the bottom surface of the substrate W from the first support member 111 to the second support member 112 after the cleaning.

The substrate transfer apparatus may be constructed in such a manner that an uncleaned substrate W is supported by only the second support member 112 and the cleaned substrate W is supported by only the first support member 111. With this configuration, too, contaminants will be prevented from sticking to the cleaned substrate again.

Figure 36:
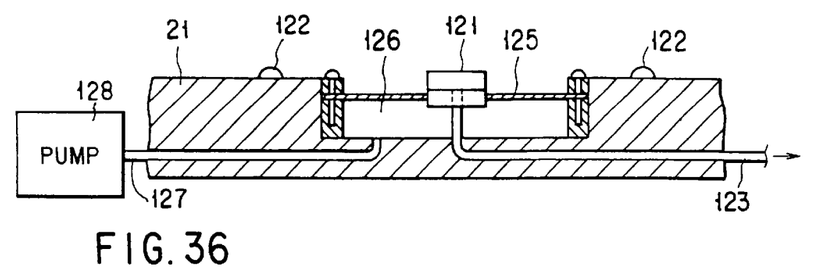
FIG. 36 is a sectional view of an arm where one of the first support member and second support member on the top face of the arm is designed to move up and down freely.

FIG. 36 shows an embodiment where one of a first support member 121 and a second support member 122 both provided on the top face of the arm 21 is designed to go up and down freely. In the embodiment, the first support member 121 is designed to go up and down freely and second support members 122 constructed by projections fixed to the top face of the arm 21 are provided on both sides of the first support member 121. In the example shown in the figure, the first support member 121 is made up of a suction pad. A circuit 123 is connected to the first support member 121. As described later, the bottom surface of the substrate W above the first support member 121 can be sucked by sucking through the circuit 123. The first support member 121 constructed by a suction pad is supported at the top face of a diaphragm 125. Under the bottom face of the diaphragm 125, a pressure adjusting chamber 126 is formed. A circuit 127 is connected to the pressure adjusting chamber 126. As described later, the supply of compressed air from a pump 128 to the pressure adjusting chamber 126 via the circuit 127 causes the diaphragm 125 to expand upward, raising the first support member 121, whereas the depressurization of the pressure adjusting chamber 126 via the circuit 127 causes the diaphragm 125 to dent downward, permitting the first support member 121 to go down. Although FIG. 36 shows only one first support member 121 and only two second support members 122 on both sides of the first support member to simplify the explanation, at least three sets of the first support member 121 and two second support members 122 are provided on the top face of the arm 21.

Figure 37:
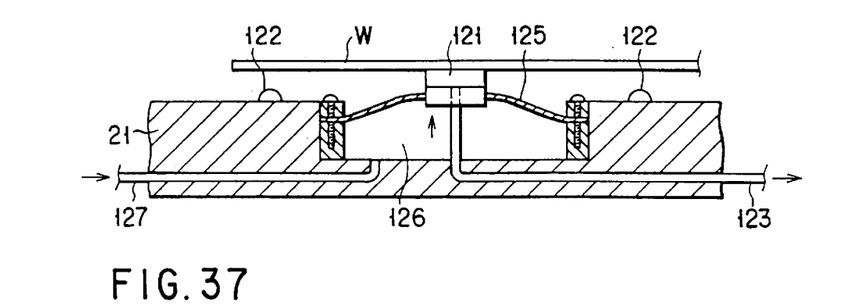
FIG. 37 is a sectional view to help explain a state where an uncleaned substrate is transferred in the embodiment of FIG. 36.

In the embodiment, when an uncleaned substrate W is transferred while being kept on the arm 21, the supply of compressed air to the pressure adjusting chamber 126 via the circuit 127 causes the diaphragm 125 to expand upward, raising the first support member 121, as shown in FIG. 37. As a result, the first support member 121 is higher than the second support members 122, which allows the bottom surface of the substrate W to be supported by only the first support member 121. In this case, the suction through the circuit 123 causes the bottom surface of the substrate W to be sucked by the first support member 121 constructed by a suction pad.

Figure 38:
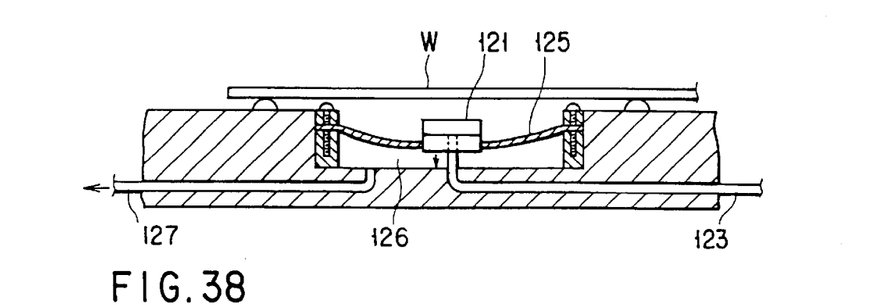
FIG. 38 is a sectional view to help explain a state where a cleaned substrate is transferred in the embodiment of FIG. 36.

When the cleaned substrate W is transferred, the depressurization of the pressure adjusting chamber 126 via the circuit 127 causes the diaphragm 125 to dent downward, permitting the first support member 121 to go down. As a result, the first support member 121 is lower than the second support members 122, which allows the bottom surface of the substrate W to be supported by only the second support members 122. In this case, sucking is not done via the circuit 123.

With the embodiment of FIG. 36, too, the contaminants stuck from the uncleaned substrate W to the first support member 121 are prevented from sticking to the cleaned substrate W again by switching the support member that supports the bottom surface of the substrate W from the first support member 121 to the second support member 122 after the cleaning. Although the first support member 121 has been designed to go up and down freely and the second support members 122 have been fixed on the top face of the arm 21, the second support members 122 may be designed to go up and down freely and the first support member 121 may be fixed on the top face of the arm 21. Moreover, an uncleaned substrate W may be supported by only the second support members 122 and the cleaned substrate W may be supported by only the first support member 121.

Figure 39:
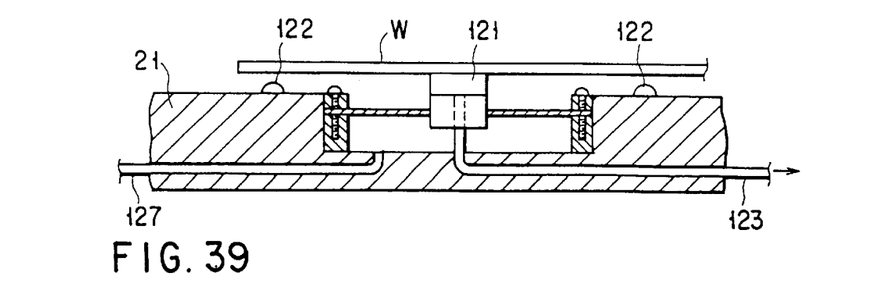
FIG. 39 is a sectional view of an arm according to a modification of the embodiment of FIG. 36.
Figure 40:
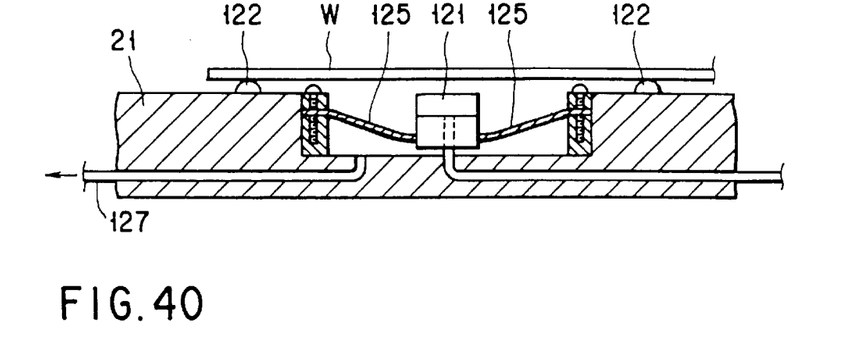
FIG. 40 is a sectional view to help explain a state where a cleaned substrate is transferred in the modification of FIG. 39.

FIG. 39 shows a modification of the embodiment explained in FIG. 36. In the modification, when the pressure adjusting chamber 126 below the first support member 121 is not depressurized, the first support member 121 is higher than the second support members 122, whereas when the pressure adjusting chamber 126 is depressurized, the first support member 121 is lower than the second support members 122. With the modification, when an uncleaned substrate W is transferred while being kept on the arm 21, depressurization is not effected through the circuit 127 as shown in FIG. 39. As a result, the first support member 121 is higher than the second support members 122, which allows the bottom surface of the substrate W to be supported by the first support member 121. The suction through the circuit 123 causes the first support member 121 constructed by a suction pad to suck the bottom surface of the substrate W. When the cleaned substrate W is transferred, the pressure adjusting chamber 126 is depressurized through the circuit 127, denting the diaphragm 125 downward as shown in FIG. 40. This causes the first support member 121 to go down, making the first support member 121 lower than the second support members 122, which allows the bottom surface of the substrate W to be supported by the second support members 122. In this case, suction through the circuit 123 is not effected. With the modification of FIG. 39, too, the contaminants stuck from the uncleaned substrate W to the first support member 121 are prevented from sticking to the cleaned substrate W again by switching the support member that supports the bottom surface of the substrate W from the first support member 121 to the second support member 122 after the cleaning. The second support members 122 may be designed to go up and down freely and the first support member 121 may be fixed on the top face of the arm 21. Moreover, in the modification, an uncleaned substrate W may be supported by only the second support members 122 and the cleaned substrate W may be supported by only the first support member 121.

Figure 41:
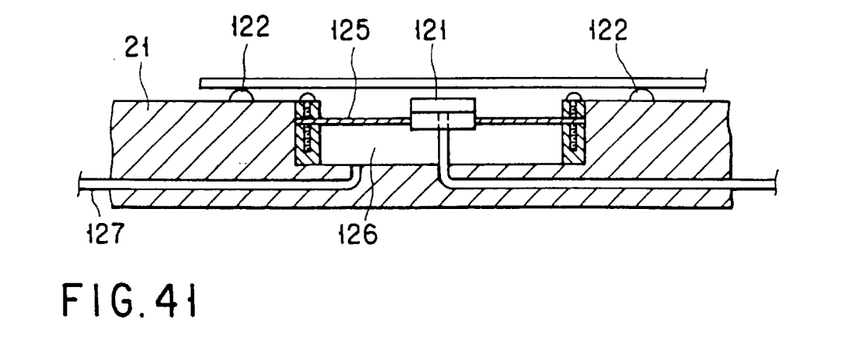
FIG. 41 is a sectional view of an arm according to another modification of the embodiment of FIG. 36.
Figure 42:
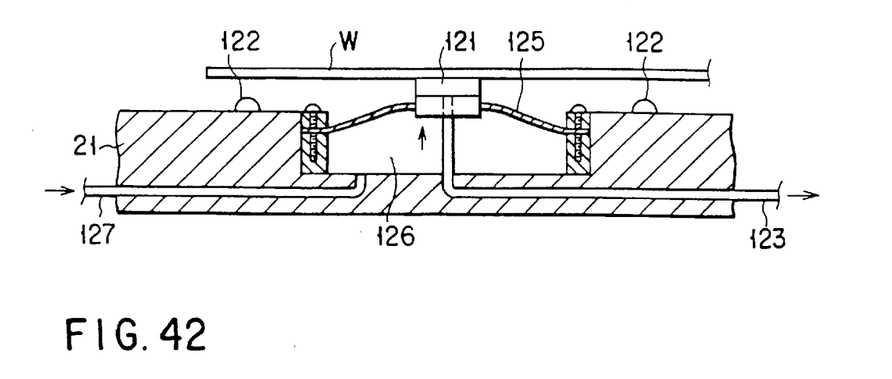
FIG. 42 is a sectional view to help explain a state where an uncleaned substrate is transferred in the modification of FIG. 41.

FIG. 41 shows another modification of the embodiment explained in FIG. 36. In the modification, when the pressure adjusting chamber 126 below the first support member 121 is not pressurized, the first support member 121 is lower than the second support members 122, whereas when the supply of high-pressure air to the pressure adjusting chamber 126 expands the diaphragm 125 upward, the first support member 121 is higher than the second support members 122. With the modification, when an uncleaned substrate W is transferred while being kept on the arm 21, the supply of high-pressure air to the pressure adjusting chamber 126 via the circuit 127 expands the diaphragm 125 upward as shown in FIG. 42. As a result, the first support member 121 is higher than the second support members 122, which allows the bottom surface of the substrate W to be supported by only the first support member 121. The suction through the circuit 123 causes the first support member 121 constructed by a suction pad to suck the bottom surface of the substrate W. When the cleaned substrate W is transferred, high-pressure air is not supplied through the circuit 127 as shown in FIG. 41. As a result, the first support member 121 is lower than the second support members 122, which allows the bottom surface of the substrate W to be supported by only the second support members 122. In this case, suction through the circuit 123 is not effected. With the modification of FIG. 41, too, the contaminants stuck from the uncleaned substrate W to the first support member 121 are prevented from sticking to the cleaned substrate W again by switching the support member that supports the bottom surface of the substrate W from the first support member 121 to the second support member 122 after the cleaning. In the modification, the second support members 122 may be designed to go up and down freely and the first support member 121 may be fixed on the top face of the arm 21. Moreover, an uncleaned substrate W may be supported by only the second support members 122 and the cleaned substrate W may be supported by only the first support member 121.

Although the embodiments of the present invention have been explained using the cleaning machine 1 for cleaning substrates W, the substrate transfer apparatus of the invention may be applied to various processing systems which perform other processes, such as drying substrates or applying a resist film on a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate transfer method of transferring a substrate supported by a moving arm to a processing machine, the method comprising:

disposing on an upper surface of the arm a plurality of support sets each including a first suction pad and a second suction pad to support the substrate, the first and second suction pads being supported on first and second bags selectively expanded by supply of fluid thereto;

supplying fluid to the first bag to support the substrate with the first suction pad rising due to expansion of the first bag when loading the substrate into the processing machine; and supplying fluid to the second bag to support the substrate with the second suction pad rising due to expansion of the second bag when unloading the substrate from the processing machine.

2. The method according to claim 1, wherein the processing machine is a cleaning machine for cleaning a substrate.

* * * * *